US010505353B2

(12) United States Patent
Sundet et al.

(10) Patent No.: US 10,505,353 B2
(45) Date of Patent: Dec. 10, 2019

(54) TERMINAL HOUSINGS, COVERS, AND PLATE APPARATUS

(71) Applicant: Illinois Tool Works Inc., Glenview, IL (US)

(72) Inventors: Michelle Sundet, Burnsville, MN (US); James Sarauer, Cottage Grove, MN (US)

(73) Assignee: Illinois Tool Works Inc., Glenview, IL (US)

( * ) Notice: Subject to any disclaimer, the term of this patent is extended or adjusted under 35 U.S.C. 154(b) by 0 days.

(21) Appl. No.: 16/179,036

(22) Filed: Nov. 2, 2018

(65) Prior Publication Data

US 2019/0140436 A1    May 9, 2019

Related U.S. Application Data

(60) Provisional application No. 62/582,668, filed on Nov. 7, 2017.

(51) Int. Cl.
*H02G 3/08* (2006.01)
*H02G 3/14* (2006.01)
*H01R 9/24* (2006.01)
*H05K 7/12* (2006.01)

(52) U.S. Cl.
CPC .............. *H02G 3/081* (2013.01); *H01R 9/24* (2013.01); *H02G 3/14* (2013.01); *H05K 7/12* (2013.01)

(58) Field of Classification Search
CPC . H02G 3/081; H02G 3/14; H01R 9/24; H05K 7/12
See application file for complete search history.

(56) References Cited

U.S. PATENT DOCUMENTS

| 5,734,149 A | 3/1998 | Skutt |
| 6,838,997 B1 | 1/2005 | Davidson |
| 7,170,020 B2 | 1/2007 | Kawata et al. |

OTHER PUBLICATIONS

Int'l Search Report and Written Opinion Appln. PCT/US2018/059552 dated Jan. 28, 2019 (12 pgs.).

*Primary Examiner* — James Wu
*Assistant Examiner* — Hung Q Dang
(74) *Attorney, Agent, or Firm* — McAndrews, Held & Malloy, Ltd.

(57) ABSTRACT

Terminal housings, covers, and plate apparatus are disclosed. An example tamper protected terminal housing includes a back wall, a first side wall having a first slot, a second side wall opposite the first side wall and having a second slot, and a removable terminal plate. The removal terminal plate includes a deflection surface connecting a second tab to a planar body, the deflection surface positioned such that a deflection tool can be inserted between the deflection surface and the second side wall when the terminal plate is installed in the housing with the first tab engaged in the first slot and the second tab engaged in the second slot, the side walls configured to deflect at least a first distance to enable disengagement of the second tab from the second slot and removal of the terminal plate from the terminal housing.

16 Claims, 9 Drawing Sheets

TERMINAL HOUSINGS, COVERS, AND PLATE APPARATUS

RELATED APPLICATIONS

This patent claims priority to U.S. Provisional Patent Application Ser. No. 62/582,668, filed Nov. 7, 2017, entitled "Terminal Housings, Covers, and Plate Apparatus." The entirety of U.S. Provisional Patent Application Ser. No. 62/582,668 is incorporated herein by reference.

BACKGROUND

Powered industrial devices such as industrial ovens require input and output terminals for power and other control lines. It is desirable to wire the devices internally, such that a customer may not tamper with the internal wiring. However, it is also desirable that the manufacturer can easily access the internal wiring when necessary.

Limitations and disadvantages of conventional approaches to providing terminal inputs and outputs for industrial devices will become apparent to one of skill in the art, through comparison of such approaches with some aspects of the present apparatus and system set forth in the remainder of this disclosure with reference to the drawings.

SUMMARY

Terminal housings, covers, and plate apparatus are disclosed, substantially as illustrated by and described in connection with at least one of the drawings, as set forth more completely in the claims.

BRIEF DESCRIPTION OF THE DRAWINGS

The figures are not necessarily to scale. Where appropriate, similar or identical reference numbers are used to refer to similar or identical components.

DETAILED DESCRIPTION

Disclosed example apparatus also allow installation technicians, customers, and/or other users, to easily connect an industrial device to electric power and/or other control wires, while protecting internal components of an industrial device, such as electronics and wiring, from tampering by customers or other users, and from other external destructive forces. Disclosed examples provide access to an authorized person (e.g., a manufacturer-authorized technician) to the internal wiring of the industrial device. Disclosed examples provide such a terminal housing apparatus. Aspects of the present disclosure include a terminal housing, a cover for the terminal housing, terminal blocks, and a terminal plate.

Disclosed example tamper protected terminal housings include: a back wall; a first side wall having a first slot; a second side wall opposite the first side wall and having a second slot; and a removable terminal plate. The removable terminal plate includes: a planar body substantially perpendicular to the back wall, the first side wall, and the second side wall; a first tab at a first end of the planar body, the first tab configured to engage the first slot; a second tab configured to engage the second slot; and a deflection surface connecting the second tab to the planar body. The deflection surface is positioned such that a deflection tool can be inserted between the deflection surface and the second side wall when the removable terminal plate is installed in the terminal housing with the first tab engaged in the first slot and the second tab engaged in the second slot. The first and second side walls deflect at least a first distance to enable disengagement of the second tab from the second slot and removal of the terminal plate from the terminal housing.

In some examples, the deflection surface is substantially perpendicular to the planar body. In some such examples, the second tab is perpendicular to the deflection surface. In some example terminal housings, the second slot is not co-planar with the first slot.

In some examples, the first side wall and the second side wall deflect in response to insertion and manipulation of the deflection tool between the deflection surface and the second side wall. In some examples, wherein the deflection surface extends across a first partial width of the planar body. Some such example terminal housings include a stop plate coupled to the planar body via a folded tab, in which the stop plate and the folded tab may be loaded by the second side wall to resist vibration of the terminal plate when the terminal plate is installed in the terminal housing. In some such examples, the terminal plate, the first tab, the second tab, the deflection surface, the folded tab, and the stop plate are constructed from a same piece of material. In some examples, the folded tab is configured to be capable of being physically grasped from an interior of the terminal housing. In some examples, the terminal plate includes a hole.

Disclosed example systems for providing power to an oven include: an oven having internal electrical components; and a user accessible terminal housing. The terminal housing includes: a back wall; a first side wall having a first slot; a user accessible terminal block connected to the internal electrical wiring for connecting external power to the oven; a second side wall opposite the first side wall and having a second slot; and a removable terminal plate. The removable terminal plate includes: a planar body substantially perpendicular to the back wall, the first side wall, and the second side wall; a first tab at a first end of the planar body, in which the first tab configured to engage the first slot; a second tab configured to engage the second slot; and a deflection surface connecting the second tab to the planar body. The deflection surface is positioned such that a deflection tool can be inserted between the deflection surface and the second side wall when the removable terminal plate is installed in the terminal housing with the first tab engaged in the first slot and the second tab engaged in the second slot. The first and second side walls configured to deflect at least a first distance to enable disengagement of the second tab from the second slot and removal of the terminal plate from the terminal housing.

In some example systems, the deflection surface is substantially perpendicular to the planar body. In some such examples, the second tab is perpendicular to the deflection surface. In some examples, the second slot is not co-planar with the first slot. In some examples, the first side wall and the second side wall are configured to deflect in response to insertion and manipulation of the deflection tool between the deflection surface and the second side wall.

In some example systems, the deflection surface extends across a first partial width of the planar body. Some such example systems further include a stop plate coupled to the planar body via a folded tab, in which the stop plate and the folded tab may be loaded by the second side wall to resist vibration of the terminal plate when the terminal plate is installed in the terminal housing. In some examples, the terminal plate, the first tab, the second tab, the deflection surface, the folded tab, and the stop plate are constructed from a same piece of material. In some examples, the folded tab is configured to be capable of being physically grasped from an interior of the terminal housing by a user external to the oven. In some example systems, the terminal plate comprises a mounting hole.

Figure 1:
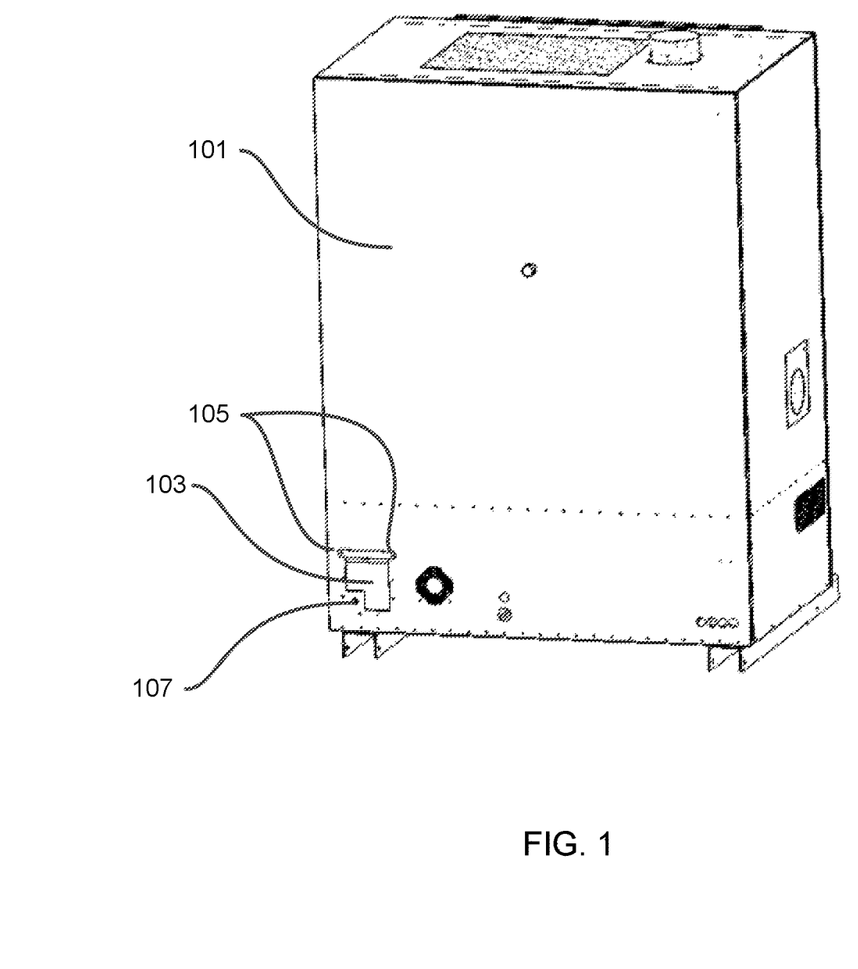
FIG. 1 illustrates an example industrial oven including a terminal housing, in accordance with aspects of this disclosure.

FIG. 1 shows an example of an industrial oven 101 including a terminal housing. FIG. 1 shows the industrial oven 101 and a cover 103 for a terminal housing located on an exterior of the industrial oven 101. The terminal housing is described in more detail below. The example oven 101 has internal electronics and/or wiring (e.g., power components, control components, etc.) which are protected and/or isolated from external destructive forces when terminal housing apparatus is installed. A small opening 107 may be located proximate to the cover 103. The small opening 107 leads into the terminal housing. The small opening 107 may be used to run cables into the terminal housing, and the small opening 107 may be sized so that one or more cables having one or more respective cable diameters may be used with the industrial oven 101. The cover 103 is secured to the industrial oven 101 (e.g., by a tab and slot and/or using screws at mounting holes 105). In some examples, the screws used to affix the cover 103 to the industrial oven 101 may be PEM captivated screws, which advantageously prevent the loss of the screws.

Figure 2:
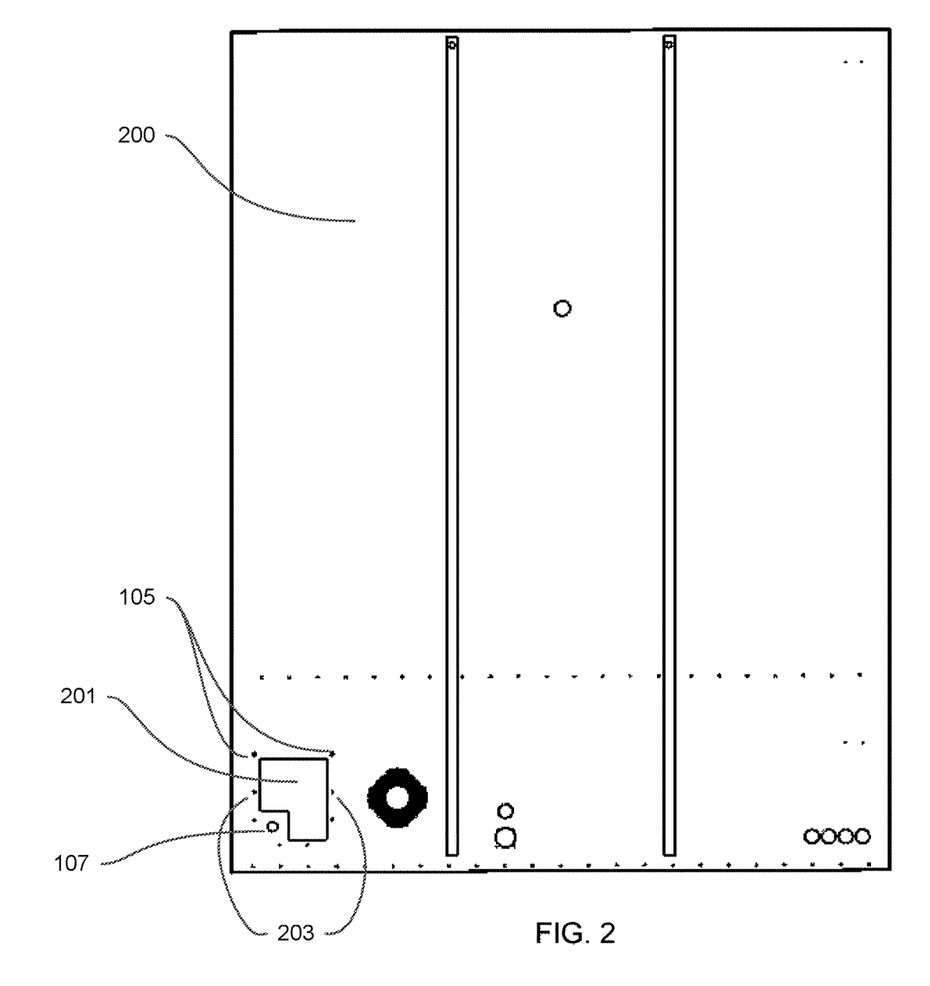
FIG. 2 illustrates an example wall of an industrial device upon which a terminal housing and cover may be mounted, in accordance with aspects of this disclosure.

FIG. 2 shows an example of a wall 200 of an industrial device to which a terminal housing and cover 103 may be affixed in accordance with aspects of this disclosure. The wall 200 may contain a small opening 107 which can be used to run cables into the terminal housing. The wall 200 contains an access opening 201. A terminal housing may be attached to the back side of wall 200 in such a way that the terminal housing covers the back side of the access opening 201. A cover 103 may be affixed to the front side of the wall 200 to close the front side of the access opening 201. The terminal housing may be affixed to the wall 200 using aligned mounting holes 203. The mounting holes 105 may also be used to affix the cover 103 to the wall 200 over the access opening 201.

Figure 3:
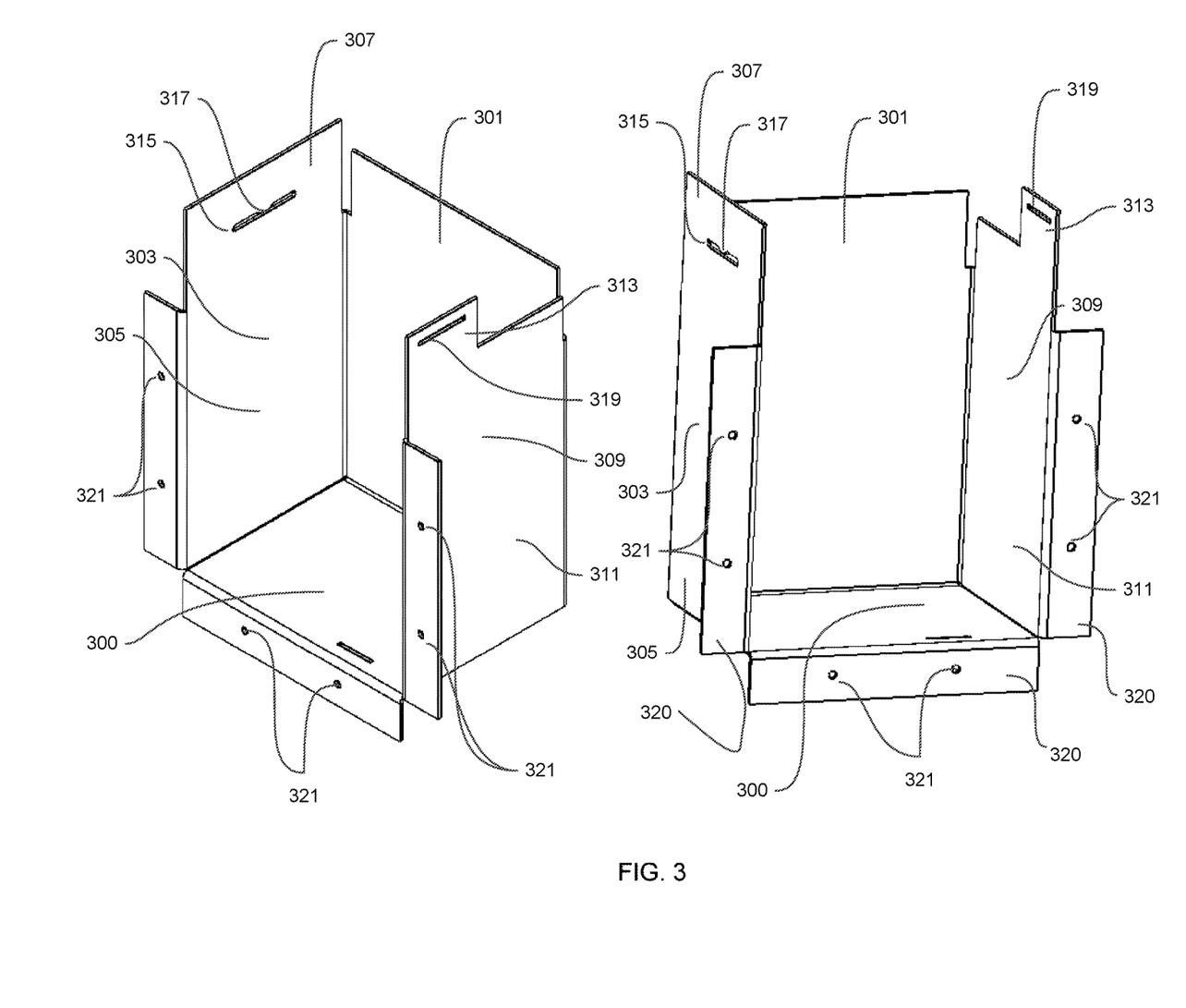
FIG. 3 illustrates an example terminal housing in accordance with aspects of this disclosure.

FIG. 3 shows an example of a terminal housing 300. The terminal housing 300 has a first side wall 303, a second side wall 309, and a back wall 301. In the example of FIG. 3, the side walls 303 and 309 have lower portions 305 and 311 and upper portions 307 and 313. The lower portions 305, 311 are contiguous with the back wall 301, while the upper portions 307 and 313 are not contiguous with the back wall 301. The discontinuity between the upper portions 307 and 313 and the back wall 301 allows the upper portions 307 and 313 of the side walls 303 and 309 to flex laterally. The example side walls 303 and 309 are resilient, such that the upper portions 307 and 313 act as a cantilever and/or as a spring.

The upper portion 307 of the first side wall 303 has a first slot 315. The example first slot 315 includes an extended feature 317. The upper portion 313 of the second side wall 309 has a second slot 319. The example terminal housing 300 includes flanges 320 having mounting holes 321 that may be used to affix the terminal housing 300 to a wall of an industrial device, such as the wall 200 of the industrial device in FIG. 2.

Figure 4A:
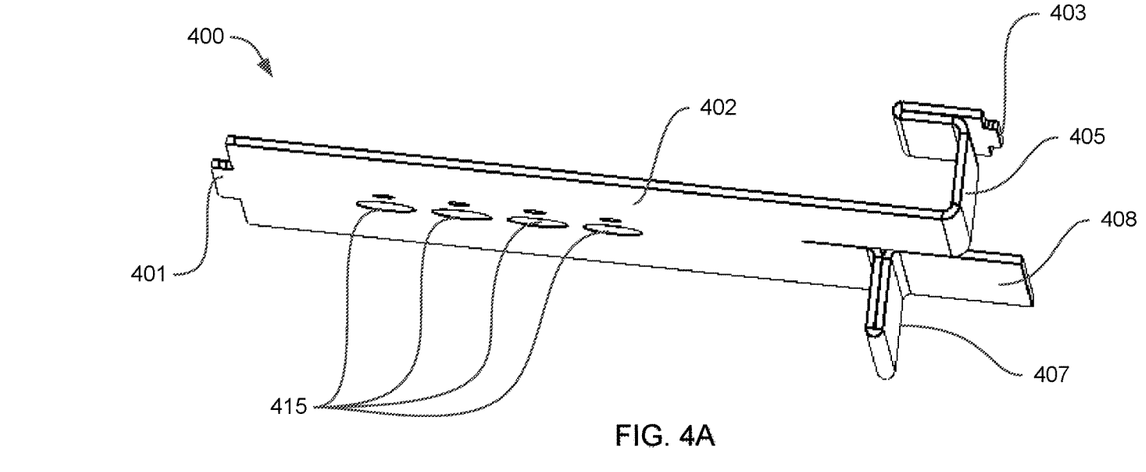
FIGS. 4A and 4B illustrates an example terminal plate in accordance with aspects of this disclosure.
Figure 4B:
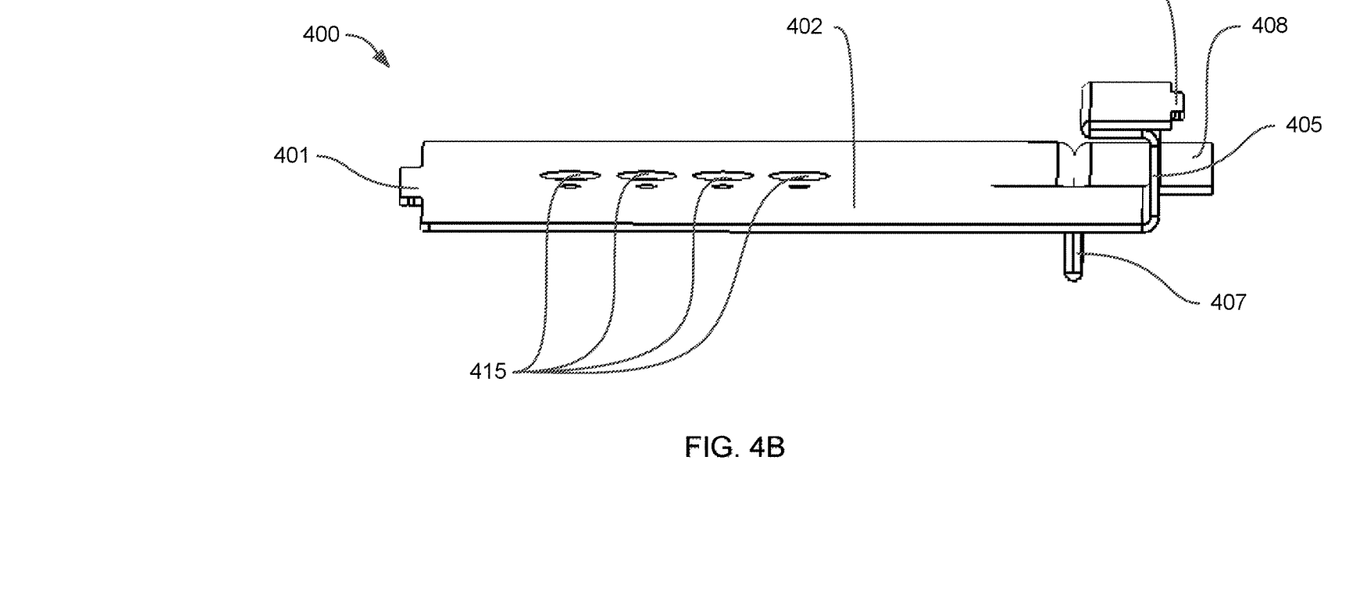

FIGS. 4A and 4B show an example terminal plate 400. The example terminal plate 400 interfaces with the terminal housing 300 to block access to the internal wiring of the device. The terminal plate 400 snaps into the terminal housing 300 such that a user authorized by the manufacturer may disengage the terminal plate 400 from the terminal housing 300 in order to access the internal wiring of the device. The authorized user may then re-engage the terminal plate 400 to the terminal housing 300 to protect the internal wiring and/or components. However, the removal capability of the terminal plate 400 may be obscured so as to reduce or prevent removal of the terminal plate 400 by unauthorized personnel.

The example terminal plate 400 has a substantially planar body 402. The terminal plate 400 has a first tab 401 configured to engage the first slot 315. The terminal plate 400 has a second tab 403 configured to engage the second slot 319. In some examples, a vertical deflection surface 405 connects the second tab 403 to the planar body 402. The example vertical deflection surface 405 is substantially perpendicular to the planar body 402, and the second tab 403 is approximately parallel to the planar body 402 and approximately perpendicular to the deflection surface 405. The deflection surface 405 of the illustrated example causes the second tab 403 to not be co-planar with the planar body 402. However, in other examples, the deflection surface 405 and the second tab 403 may be implemented such that the second tab 403 and the planar body 402 are co-planar.

In the example of FIGS. 4A and 4B, the deflection surface 405 is positioned such that a deflection tool can be inserted between the deflection surface 405 and the upper portion 313 of the second side wall 309 when the terminal plate 400 is engaged to the terminal housing 300. An example deflection tool may be a standard or common flat head screwdriver. Once inserted, manipulation of the deflection tool (e.g., twisting, turning, etc.) pushes the deflection surface 405 and the upper portion 313 apart, causing the second tab 403 of the terminal plate 400 to disengage slot 319 of the terminal housing 300. The deflection surface 405 may be flexible and elastic, such the deflection surface 405 acts as a spring, allowing the second tab 403 to snap into the second slot 319 securely. Deflection may occur at any of the upper portion 307 of the first side wall 303, the upper portion 313 of the second side wall 309, and/or the deflection surface 405 (e.g., with respect to the planar body 402), to create separation between the second tab 403 and the second slot 319.

In certain aspects of the disclosure, the deflection surface 405 may only assume a partial width of the terminal plate 400 at the second end of the terminal plate 400. The other partial width of the second end of the terminal plate 400 may be assumed by a stop plate 408 and a folded tab 407 that couples the stop plate 408 to the planar body 402. The example stop plate 408 is coplanar with the planar body 402. When the terminal plate 400 is installed in the terminal housing 300 (e.g., both of the tabs 401 and 403 are engaged with the corresponding slots 315, 319), the stop plate 408 may lie flat over the upper portion 313 of the side wall 309 of the terminal housing 300 to protect the internal components of the device. The folded tab 407 allows the user to grasp and pull down the terminal plate 400 (e.g., from a position external to the device, via an interior of the terminal housing 300 on the device) to engage or disengage the terminal plate 400 from the terminal housing 300. The example stop plate 408 may rest on the second side wall 309 when the terminal plate 400 is installed in the terminal housing 300. In some examples, the example stop plate 408 and/or the folded tab 407 may be loaded by the second side wall 309 (e.g., based on the positioning of the stop plate 408 relative to the second tab 304) to reduce vibration of the terminal plate 400.

The example folded tab 407 also provides a component that can be grasped and pulled (e.g., by a technician or other user) from inside the terminal housing 300 to install the terminal plate 400 in the terminal housing 300.

In certain aspects of the disclosure, the planar body 402, the first tab 401, the second tab 403, the deflection surface 405, the folded tab 407, and the stop plate 408 are constructed from a same piece of material.

Terminal holes 415 may be included on the planar body 402. Terminal holes 415 may be used to hold terminal blocks which connect external input and output wires to the internal wiring of the device.

Figure 5:
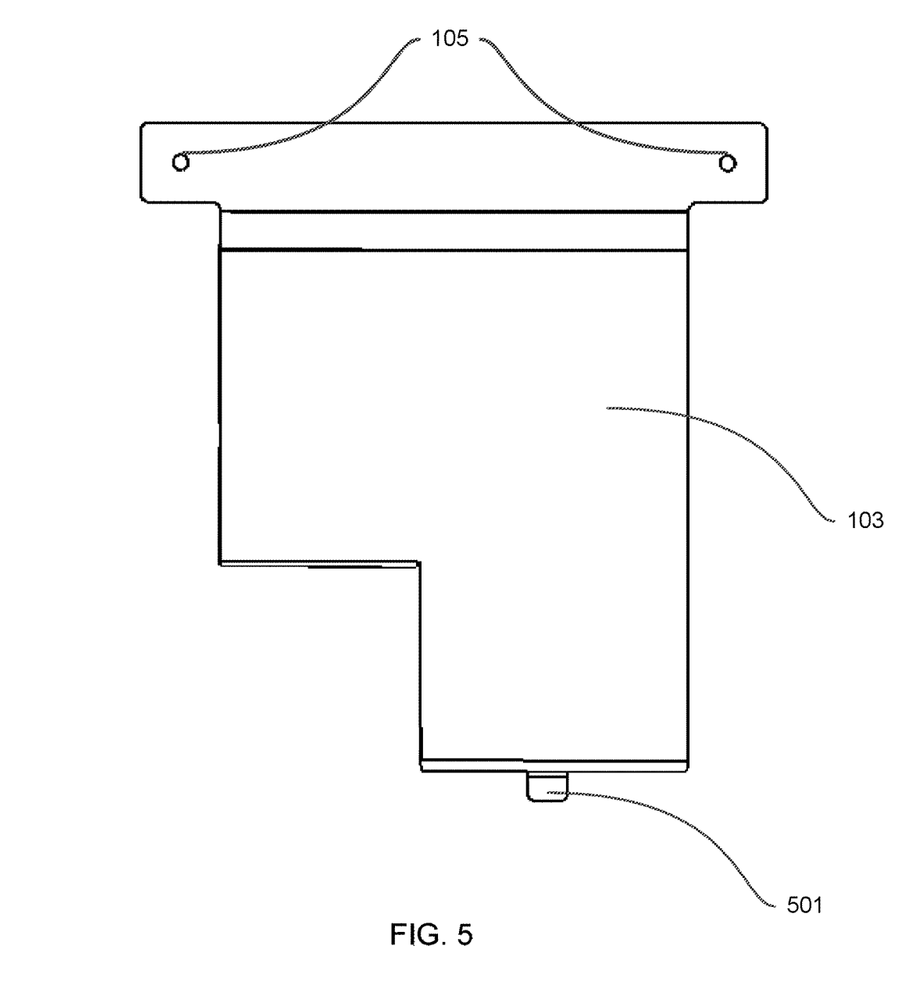
FIG. 5 illustrates an example cover for the terminal housing in accordance with aspects of this disclosure.

FIG. 5 shows an example of a front cover for the terminal housing when the terminal housing is connected to a device according to certain aspects of the disclosure. The terminal housing 300 may be connected to the inside of a wall 200 of an industrial device. The wall may have an opening 201, and a cover 103 as exemplified in FIG. 5 may be used to cover the opening in the wall 200. In some examples, the cover 103 is secured to the wall 200 via screws inserted through the mounting holes 105 in the cover 103. The cover may also have a tab 501 which slides into a slot in the wall 200 to keep the cover 103 securely in place.

Figure 6:
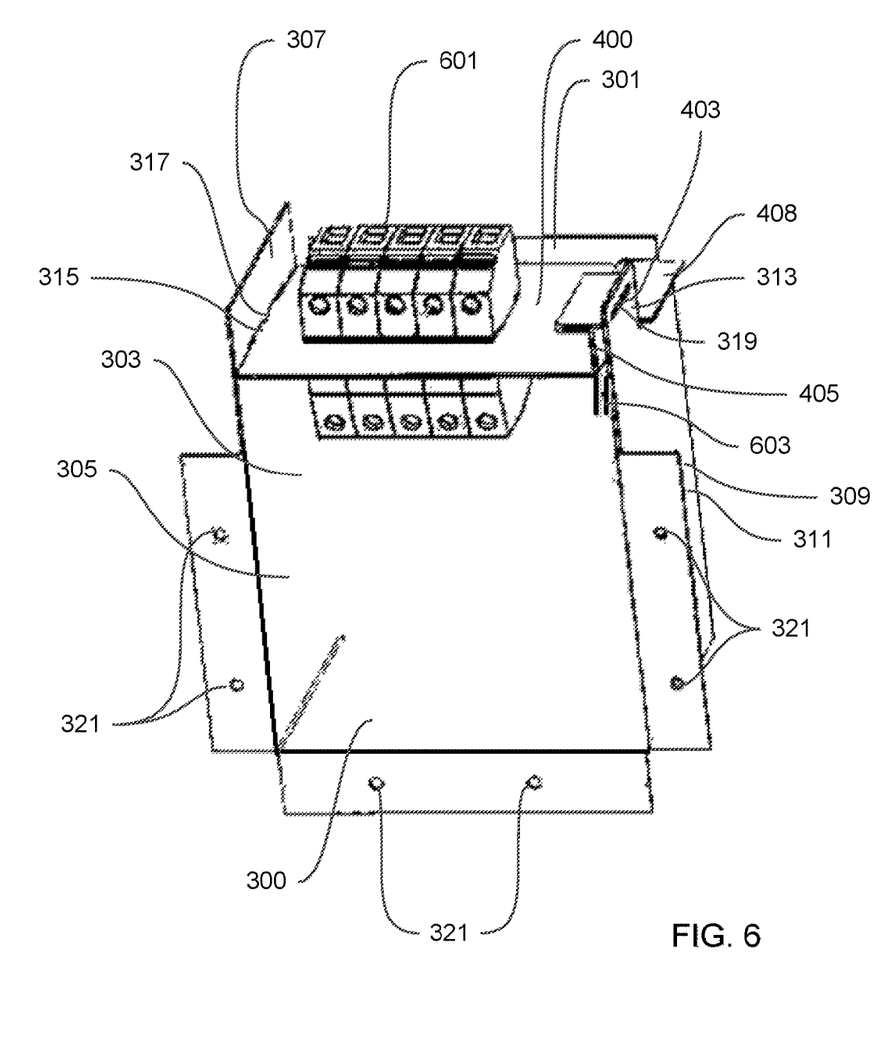
FIG. 6 illustrates an example terminal housing, the example terminal plate of FIGS. 4A and 4B engaged with the terminal housing, and terminal blocks configured into the terminal plate, in accordance with aspects of this disclosure.

FIG. 6 shows an example of the terminal plate 400 installed in the terminal housing 300. The terminal plate 400 snaps into the terminal housing 300 and is held in place by the engagement of the first tab 401 into the first slot 315 on the first side wall 303 of the terminal housing 300 and the engagement of the second tab 403 into the second slot 319 on the second side wall 309 of the terminal housing 300. A slight extended feature 317 holds the terminal plate 400 securely into place to reduce or prevent rattling and/or vibration when the terminal plate 400 is engaged to the terminal housing 300. Terminal blocks 601 may be coupled to the terminal plate 400, and input and output terminal blocks may be positioned in the terminal holes 415. As mentioned above, when the terminal plate 400 is engaged with the terminal housing 300, the stop plate 408, the folded tab 407, and/or the deflection surface 405 function as springs that may be loaded by the second side wall 309 to resist vibration of the terminal plate 400.

As discussed above, a space 603 is present between the deflection surface 405 and the second side wall 309. A deflection tool may be inserted into the space 603 to deflect the deflection surface 405 a sufficient distance to enable the second tab 403 to disengage from the second slot 319, thereby enabling the disengagement of the terminal plate 400 from the terminal housing 300. Example deflection tools may be a flat head screwdriver. The width of the deflection tool should be smaller than the space 603 so that the deflection tool may be inserted into the space 603. In some examples, the space 603 between the deflection surface 405 and the second side wall 309 may be 0.185 inches, which is large enough to insert multiple different sizes of flat tip screwdrivers as a deflection tool to disengage the terminal plate 400 from the terminal housing 300.

As illustrated in FIG. 6, the folded tab 407 may be capable of being physically grasped from the interior of the terminal housing 300 and external to the device.

Figure 7:
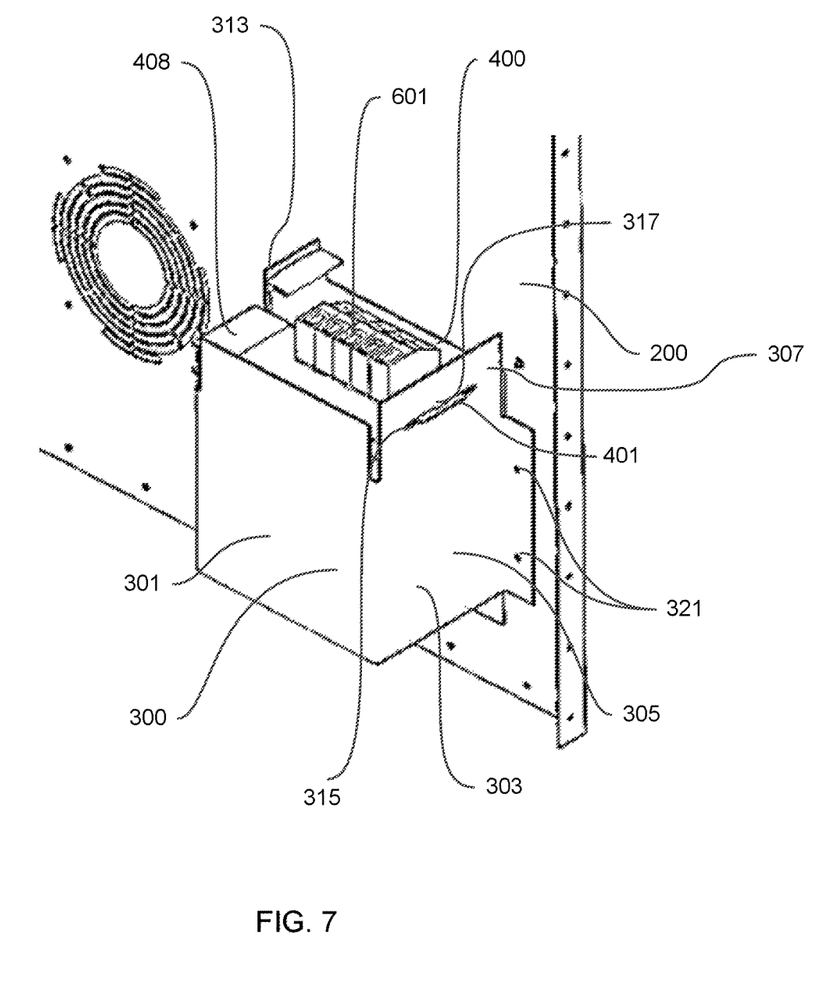
FIG. 7 is another view of the example terminal housing, the terminal plate and the terminal blocks of FIG. 6, as mounted on a wall.

FIG. 7 shows an example of the terminal plate 400 engaged with the terminal housing 300, where the terminal housing 300 is affixed to an interior wall 200 of an industrial device. The terminal housing may be affixed to the wall 200 by inserting screws, rivets, and/or any other fastener through the mounting holes 321, and/or using any other attachment technique. In some examples, the terminal blocks 601 can be further connected to the internal components of the industrial device via appropriate wiring. The terminal housing 300 and the terminal plate 400 when engaged as shown in FIG. 7 protect the internal components of the device from tampering and/or other destructive external forces.

Figure 8:
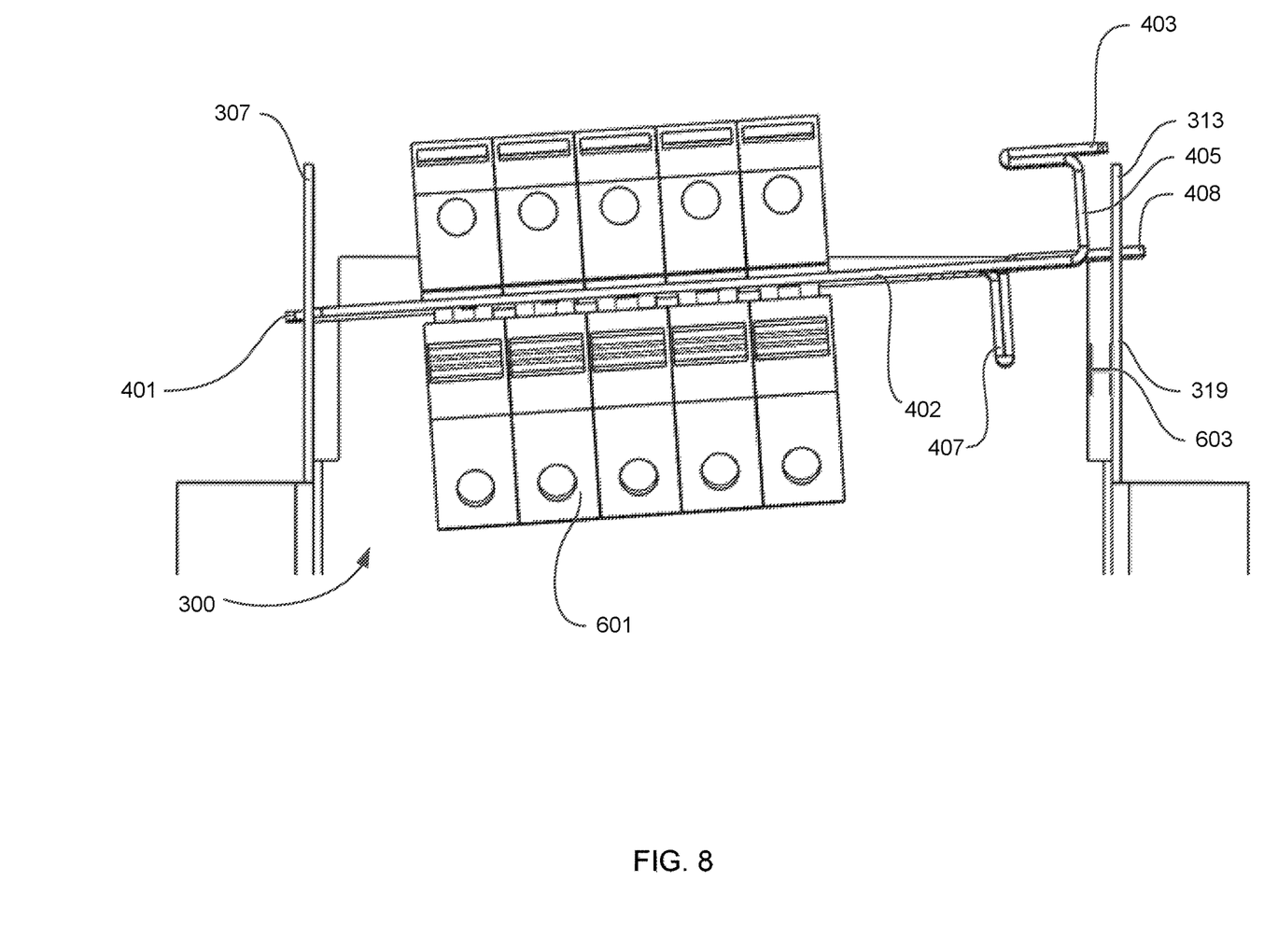
FIG. 8 illustrates the example terminal plate of FIGS. 4A, 4B, 6, and 7, disengaged from the terminal housing.
Figure 9:
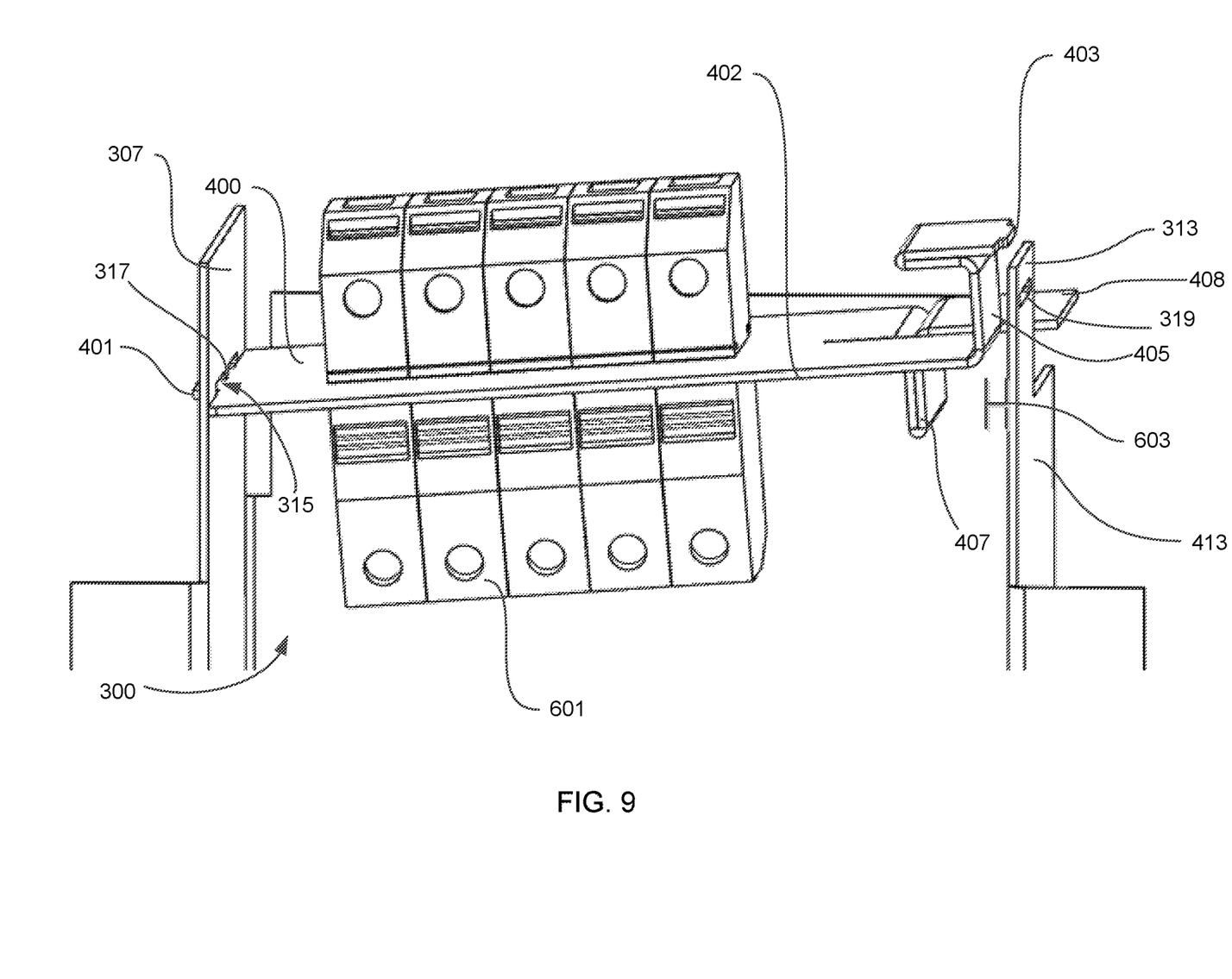
FIG. 9 is another view of the arrangement illustrated in FIG. 8 of the terminal plate disengaged from a terminal housing of FIG. 8.

FIG. 8 shows an example of the terminal plate 400 disengaging from the terminal housing 300. FIG. 9 shows another view an example of the terminal plate 400 disengaging from the terminal housing 300. A deflection tool may be inserted into the space 603 between the deflection surface 405 and the upper portion 313 of the second side wall 309. The deflection surface 405, the folded tab 407, the upper portion 313 of the second side wall 309, and the upper portion of the first side wall 303 may all be flexible, thereby acting as a spring. When the deflection tool asserts lateral pressure against the deflection surface 405, the deflection surface 405, the upper portion 313 of the second side wall 309, and the upper portion 307 of the first side wall 303 may each deflect, and in combination displace a sufficient distance to disengage the second tab 403 from the second slot 319. In one example, the deflections surface 405 must be displaced at least 3.5 degrees from the vertical position when engaged to disengage the second tab 403 from the second slot 319. Once the second tab 403 is disengaged from the second slot 319, the user may apply upwards pressure on the stop plate 408 to disengage the first tab 401 from the first slot 315. In some examples, the first tab 401 must slide at least 0.17 inches in order to disengage from the first slot 315. Once the first tab 401 and the second tab 403 are disengaged from the first slot 315 and the second slot 319, the terminal plate 400 is disengaged from the terminal housing 300. A user may then access the internal components of the industrial device.

According to certain aspects of the disclosure, the user may also re-engage the terminal plate 400 to the terminal housing 300. The user may slide the first tab 401 into the first slot 315. Then with the deflection tool, the user may apply lateral and pressure against the deflection surface 405 and/or apply downward force by pulling the folded tab 407. This pressure causes the upper portion 307 of the first side wall 303 and the deflection surface 405 to deflect a distance sufficient to insert the second tab 403 into the second slot 319. The force applied to move the second tab 403 into engagement with the second slot 319 may also impart a load on the stop plate 408, the folded tab 407, and/or the deflection surface 405. Once the first tab 401 and the second tab 403 are engaged with the first slot 315 and the second slot 319 respectively, the terminal plate 400 is engaged securely to the terminal housing 300.

As utilized herein, "and/or" means any one or more of the items in the list joined by "and/or." As an example, "x and/or y" means any element of the three-element set {(x), (y), (x, y)}. In other words, "x and/or y" means "one or both of x and y". As another example, "x, y, and/or z" means any element of the seven-element set {(x), (y), (z), (x, y), (x, z), (y, z), (x, y, z)}. In other words, "x, y and/or z" means "one or more of x, y and z". As utilized herein, the term "exemplary" means serving as a non-limiting example, instance, or illustration. As utilized herein, the terms "e.g.," and "for example" set off lists of one or more non-limiting examples, instances, or illustrations.

While the present apparatus and/or system has been described with reference to certain implementations, it will be understood by those skilled in the art that various changes may be made and equivalents may be substituted without departing from the scope of the present apparatus and/or system. In addition, many modifications may be made to adapt a particular situation or material to the teachings of the present disclosure without departing from its scope. Therefore, the present apparatus and/or system are not limited to the particular implementations disclosed. Instead, the present apparatus and/or system will include all implementations falling within the scope of the appended claims, both literally and under the doctrine of equivalents.

What is claimed is:

1. A tamper protected terminal housing comprising:
a back wall;
a first side wall having a first slot;
a second side wall opposite the first side wall and having a second slot;
a removable terminal plate, comprising:
a planar body substantially perpendicular to the back wall, the first side wall, and the second side wall;
a first tab at a first end of the planar body, the first tab configured to engage the first slot;
a second tab configured to engage the second slot; and
a deflection surface extending across a first partial width of the planar body and connecting the second tab to the planar body, the deflection surface positioned such that a deflection tool can be inserted between the deflection surface and the second side wall when the removable terminal plate is installed in the terminal housing with the first tab engaged in the first slot and the second tab engaged in the second slot, the first and second side walls configured to deflect at least a first distance to enable disengagement of the second tab from the second slot and removal of the terminal plate from the terminal housing; and
a stop plate coupled to the planar body via a folded tab, the stop plate and the folded tab configured to be loaded by the second side wall to resist vibration of the terminal plate when the terminal plate is installed in the terminal housing.

2. The terminal housing of claim 1, wherein the deflection surface is substantially perpendicular to the planar body.

3. The terminal housing of claim 2, wherein the second tab is perpendicular to the deflection surface.

4. The terminal housing of claim 1, wherein the second slot is not co-planar with the first slot.

5. The terminal housing of claim 1, wherein the first side wall and the second side wall are configured to deflect in response to insertion and manipulation of the deflection tool between the deflection surface and the second side wall.

6. The terminal housing of claim 1 wherein the terminal plate, the first tab, the second tab, the deflection surface, the folded tab, and the stop plate are constructed from a same piece of material.

7. The terminal housing of claim 1 wherein the folded tab is configured to be capable of being physically grasped from an interior of the terminal housing.

8. The terminal housing of claim 1, wherein the terminal plate comprises a hole.

9. A system for providing power to an oven comprising:
an oven having internal electrical components; and
a user accessible terminal housing comprising:
a back wall;
a first side wall having a first slot;
a user accessible terminal block connected to the internal electrical wiring for connecting external power to the oven;
a second side wall opposite the first side wall and having a second slot; and
a removable terminal plate, comprising:
a planar body substantially perpendicular to the back wall, the first side wall, and the second side wall;
a first tab at a first end of the planar body, the first tab configured to engage the first slot;
a second tab configured to engage the second slot; and
a deflection surface extending across a first partial width of the planar body and connecting the second tab to the planar body, the deflection surface positioned such that a deflection tool can be inserted between the deflection surface and the second side wall when the removable terminal plate is installed in the terminal housing with the first tab engaged in the first slot and the second tab engaged in the second slot, the first and second side walls configured to deflect at least a first distance to enable disengagement of the second tab from the second slot and removal of the terminal plate from the terminal housing; and
a stop plate coupled to the planar body via a folded tab, the stop plate and the folded tab configured to be loaded by the second side wall to resist vibration of the terminal plate when the terminal plate is installed in the terminal housing.

10. The system of claim 9, wherein the deflection surface is substantially perpendicular to the planar body.

11. The system of claim 10, wherein the second tab is perpendicular to the deflection surface.

12. The system of claim 9, wherein the second slot is not co-planar with the first slot.

13. The system of claim 9, wherein the first side wall and the second side wall are configured to deflect in response to insertion and manipulation of the deflection tool between the deflection surface and the second side wall.

14. The system of claim 9 wherein the terminal plate, the first tab, the second tab, the deflection surface, the folded tab, and the stop plate are constructed from a same piece of material.

15. The system of claim 9 wherein the folded tab is configured to be capable of being physically grasped from an interior of the terminal housing by a user external to the oven.

16. The system of claim 9, wherein the terminal plate comprises a mounting hole.

* * * * *